US009184739B2

(12) United States Patent
Kaneko et al.

(10) Patent No.: US 9,184,739 B2
(45) Date of Patent: Nov. 10, 2015

(54) GATE DRIVE CIRCUIT

(75) Inventors: Masashi Kaneko, Chiyoda-ku (JP);
Shizuri Tamura, Chiyoda-ku (JP);
Hiroshi Nakatake, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/114,572

(22) PCT Filed: Jun. 9, 2011

(86) PCT No.: PCT/JP2011/063240
§ 371 (c)(1),
(2), (4) Date: Oct. 29, 2013

(87) PCT Pub. No.: WO2012/169041
PCT Pub. Date: Dec. 13, 2012

(65) Prior Publication Data
US 2014/0055190 A1    Feb. 27, 2014

(51) Int. Cl.
*H03K 17/04* (2006.01)
*H03K 17/042* (2006.01)
*H02M 1/08* (2006.01)
(Continued)

(52) U.S. Cl.
CPC ........... *H03K 17/04206* (2013.01); *H02M 1/08* (2013.01); *H03K 17/04213* (2013.01); *H03K 17/168* (2013.01); *H03K 17/164* (2013.01); *H03K 17/74* (2013.01)

(58) Field of Classification Search
USPC ......... 327/376, 374, 379, 309, 310, 312, 313, 327/317, 108–112, 427, 434, 437, 380, 381, 327/384, 387, 389; 326/82, 83
See application file for complete search history.

(56) References Cited

U.S. PATENT DOCUMENTS 5,939,921 A     8/1999  Strauss et al.
5,986,484 A  *  11/1999  Kimata .......................... 327/108
(Continued)

FOREIGN PATENT DOCUMENTS

JP    10-135804 A      5/1998
JP    2004-282806 A   10/2004
(Continued)

OTHER PUBLICATIONS

Office Action dated Apr. 17, 2015, issued by the Korean Intellectual Property Office in counterpart Korean Patent Application No. 10-2013-7032106.
(Continued)

Primary Examiner — Lincoln Donovan
Assistant Examiner — Thomas Skibinski
(74) Attorney, Agent, or Firm — Sughrue Mion, PLLC; Richard C. Turner

(57) ABSTRACT

A gate drive circuit for driving an IGBT serving as a power semiconductor device includes a constant-current gate drive circuit that charges a gate capacity of the IGBT at a constant current, and a constant-voltage gate drive circuit that is connected in parallel to the constant-current gate drive circuit between input and output terminals thereof via a series circuit constituted by a MOSFET and a resistor, and charges the gate capacity of the IGBT at a constant voltage, wherein the gate drive circuit charges the gate capacity of the IGBT using both the constant-current gate drive circuit and the constant-voltage gate drive circuit at the time of driving the IGBT.

10 Claims, 4 Drawing Sheets

(51) Int. Cl.
  *H03K 17/16* (2006.01)
  *H03K 17/74* (2006.01)

(56) References Cited

U.S. PATENT DOCUMENTS

| | | | |
|---|---|---|---|
| 7,570,085 B2* | 8/2009 | Ishikawa et al. | 327/108 |
| 7,737,761 B2 | 6/2010 | Ishikawa et al. | |
| 7,821,306 B2* | 10/2010 | Tagome | 327/109 |
| 8,138,818 B2 | 3/2012 | Tsunoda et al. | |
| 8,829,976 B2* | 9/2014 | Kuwabara et al. | 327/419 |
| 2010/0079191 A1* | 4/2010 | Deboy | 327/379 |
| 2011/0273206 A1* | 11/2011 | Lee | 327/109 |

FOREIGN PATENT DOCUMENTS

| | | |
|---|---|---|
| JP | 2008-092663 A | 4/2008 |
| JP | 2009-011049 A | 1/2009 |
| JP | 2009-054639 A | 3/2009 |

OTHER PUBLICATIONS

Communication dated Jun. 16, 2015 from the State Intellectual Property Office of People's Republic of China in counterpart Application No. 201180071478.8.

* cited by examiner

GATE DRIVE CIRCUIT

CROSS REFERENCE TO RELATED APPLICATIONS

This application is a National Stage of International Application No. PCT/JP2011/063240 filed Jun. 9, 2011, the contents of all of which are incorporated herein by reference in their entirety.

FIELD

The present invention relates to a gate drive circuit for driving a power semiconductor device.

BACKGROUND

As a conventional gate drive circuit, the following technique has been disclosed. That is, to reduce noise caused by ringing or the like in a switching circuit including an IGBT (Insulated Gate Bipolar Transistor) that is configured to connect diodes formed of silicon carbide (SiC) having low recovery current as a material (hereinafter, "SiC diodes") in parallel (in anti-parallel, to be more precise) and that serves as a power semiconductor device while reducing the device loss of the IGBT at the time of turning on the IGBT and the diode loss during a recovery time, the conventional gate drive circuit increases resistance of resistors connected in series to the gate of the IGBT right before the IGBT is turned on so as to control a current change rate at the time of turning on the IGBT to become gradual from the middle (for example, see Patent Literature 1).

CITATION LIST

Patent Literature

Patent Literature 1: Japanese Patent Application Laid-open No. 2008-92663

SUMMARY

Technical Problem

However, this conventional technique has a problem that because the control is executed to make a current change rate at the time of turning on the IGBT to be gradual from the middle, the starting time since a start signal (a command signal) is output until the power semiconductor device actually starts operating is elongated.

Furthermore, this conventional technique is a method of changing the resistance by on-off controlling the switching device connected to both ends of one of the two resistors connected in series. Accordingly, it is necessary to make the resistance value of two resistors different from each other to some extent so as to effectively execute this control. However, when the difference of resistance value between the two resistors is large, a gate voltage disadvantageously greatly changes before and after switching the resistance value. Because the gate voltage change is one of noise increasing factors, it is preferable to avoid this gate voltage change.

The present invention has been achieved to solve the above problems, and an object of the present invention is to provide a gate drive circuit capable of reducing the starting time while suppressing the change in a gate voltage during the transition to turning on a power semiconductor device.

Solution to Problem

In order to solve the aforementioned problems, a gate drive circuit for driving a power semiconductor device according to one aspect of the present invention is configured to include: a constant-current gate drive circuit that charges a gate capacity of the power semiconductor device at a constant current; and a constant-voltage gate drive circuit that is connected in parallel to the constant-current gate drive circuit between input and output terminals thereof via a series circuit constituted by a switching device and a resistor, and charges the gate capacity at a constant voltage, wherein at the time of driving the power semiconductor device, the gate drive circuit charges the gate capacity of the power semiconductor device using both the constant-current gate drive circuit and the constant-voltage gate drive circuit.

Advantageous Effects of Invention

According to the present invention, it is possible to shorten a starting time while suppressing the change in a gate voltage (hereinafter may be referred to just as "gate voltage change") at the time of turning on a power semiconductor device.

DESCRIPTION OF EMBODIMENTS

Exemplary embodiments of a gate drive circuit according to the present invention will be explained below in detail with reference to the accompanying drawings. The present invention is not limited to the embodiments.

First Embodiment

Figure 1:
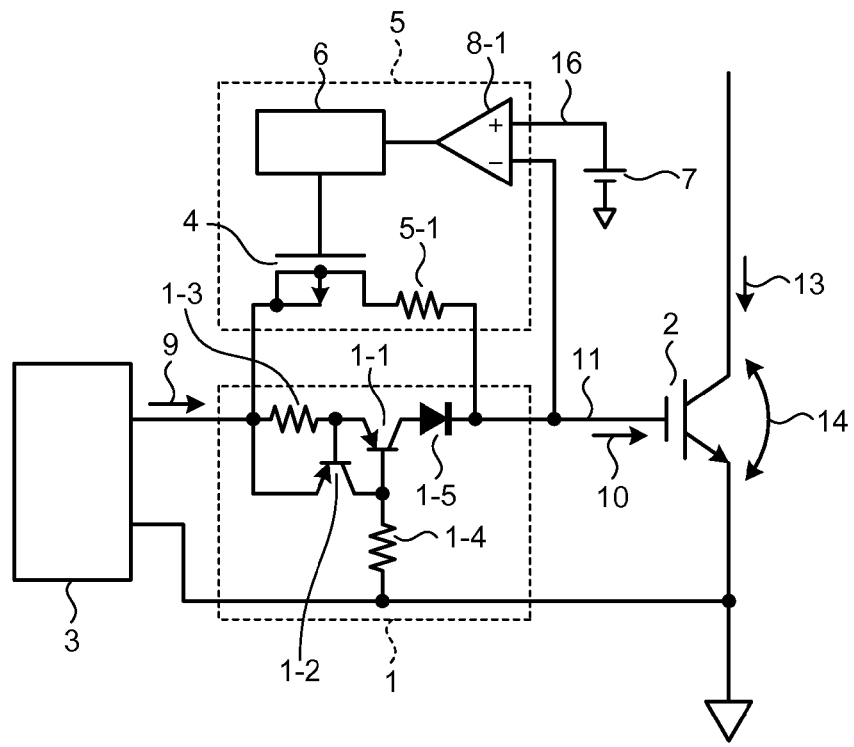
FIG. 1 depicts a configuration of a gate drive circuit according to a first embodiment.

FIG. 1 depicts a configuration of the gate drive circuit according to the first embodiment of the present invention. As shown in FIG. 1, the gate drive circuit according to the first embodiment is configured to include a constant-current gate drive circuit 1 that is connected to the gate of an IGBT 2 serving as a power semiconductor device to limit the gate current of the IGBT 2 for driving the IGBT 2, a power-semiconductor-device control circuit 3 that outputs an ON command signal (an ON command voltage) to the constant-current gate drive circuit 1, a constant-voltage gate drive circuit 5 that is connected in parallel to the constant-current gate drive circuit 1 for driving the IGBT 2 at a constant voltage, and a reference voltage source 7 that applies a reference voltage 16 to the constant-voltage gate drive circuit 5.

As shown in FIG. 1, the constant-current gate drive circuit 1 is configured to include resistors 1-3 and 1-4, transistors (PNP bipolar transistors in an example of FIG. 1) 1-1 and 1-2, and a diode 1-5 connected in series to the collector of the transistor 1-1. The cathode of the diode 1-5 serves as an output terminal of the constant-current gate drive circuit 1 and is connected to the gate of the IGBT 2. The constant-current gate drive circuit 1 includes a function of limiting the gate current 10 at the time of turning on the IGBT 2 to a predetermined upper limit.

As shown in FIG. 1, the constant-voltage gate drive circuit 5 is configured to include a MOSFET (Metal-Oxide-Semiconductor Field-Effect Transistor) 4 that is an example of the switching device, a resistor 5-1 connected in series to the MOSFET 4, a MOSFET control circuit 6 that controls the MOSFET 4 as a switching device control circuit, and a gate-voltage detection comparator 8-1 that serves as a first comparator to which a gate voltage 11 of the IGBT 2 and the reference voltage 16 applied from the reference voltage source 7 are input as input signals and that controls the MOSFET control circuit 6 according to a magnitude relation between these signals. The constant-voltage gate drive circuit 5 is connected in parallel to the constant-current gate drive circuit 1, and supplies a necessary gate current to the IGBT 2 together with the constant-current gate drive circuit 1. In the example of FIG. 1, the gate drive circuit is configured so that the source of the MOSFET 4 that constitutes one end of a series circuit constituted by the MOSFET 4 and the resistor 5-1 is connected to one end of the resistor 1-3 of the constant-current gate drive circuit 1, and one end of the resistor 5-1 of the constant-voltage gate drive circuit 5 that constitutes the other end of the series circuit is connected to the cathode of the diode 1-5. Alternatively, the gate drive circuit can be configured so that a connection relation of the series circuit constituted by the MOSFET 4 and the resistor 5-1 is reversed, whereby one end of the resistor 5-1 of the constant-voltage gate drive circuit 5 is connected to one end of the resistor 1-3 of the constant-current gate drive circuit 1 and the drain of the MOSFET 4 is connected to the cathode of the diode 1-5.

Figure 2:
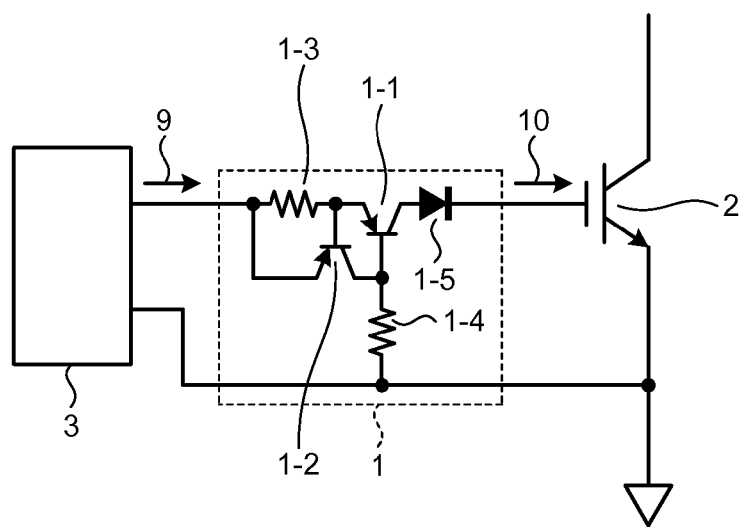
FIG. 2 depicts a circuit configuration in which a part corresponding to a constant-voltage gate drive circuit is omitted from FIG. 1.

Operations performed by the gate drive circuit according to the first embodiment are explained next. With reference to FIG. 2, the operation performed by the constant-current gate drive circuit 1 is explained first. FIG. 2 depicts a circuit configuration in which a part corresponding to the constant-voltage gate drive circuit 5 is omitted from FIG. 1.

When the IGBT 2 is to be turned on, an ON command signal 9 is input to the constant-current gate drive circuit 1 from the power-semiconductor-device control circuit 3. When the ON command signal 9 is input to the constant-current gate drive circuit 1, the transistor 1-1 enters into a conductive state, an emitter current flows via the resistor 1-3, and a base current flows via the resistor 1-4. Furthermore, a collector current flows to the transistor 1-1 via the diode 1-5, and this collector current becomes the gate current 10 flowing to the IGBT 2 and charges the gate capacity of the IGBT 2.

When the emitter current of the transistor 1-1 increases, a voltage drop increases in the resistor 1-3. Because this voltage drop applies a forward bias voltage between the base and the emitter of the transistor 1-2, the transistor 1-2 enters into a conductive state. When the transistor 1-2 is conductive, the current (the emitter current) flowing to the transistor 1-1 flows to the transistor 1-2, and the voltage drop in the resistor 1-3 decreases. On the other hand, when the voltage drop decreases in the resistor 1-3, the bias voltage between the base and the emitter of the transistor 1-2 decreases, and the transistor 1-2 changes from the conductive state into a cutoff state. In short, such an operation is performed instantaneously, and a constant current at a value obtained by dividing a forward voltage drop (0.6 volt, for example) between the base and the emitter (at a PN junction part) of the transistor 1-2 by a resistance value of the resistor 1-3 flows to the emitter of the transistor 1-1. The gate current that charges the IGBT 2 also becomes a constant current because the collector current is substantially equal to the emitter current due to transistor characteristics. In this way, the constant-current gate drive circuit 1 drives the IGBT 2 serving as the power semiconductor device at a constant current.

Figure 3:
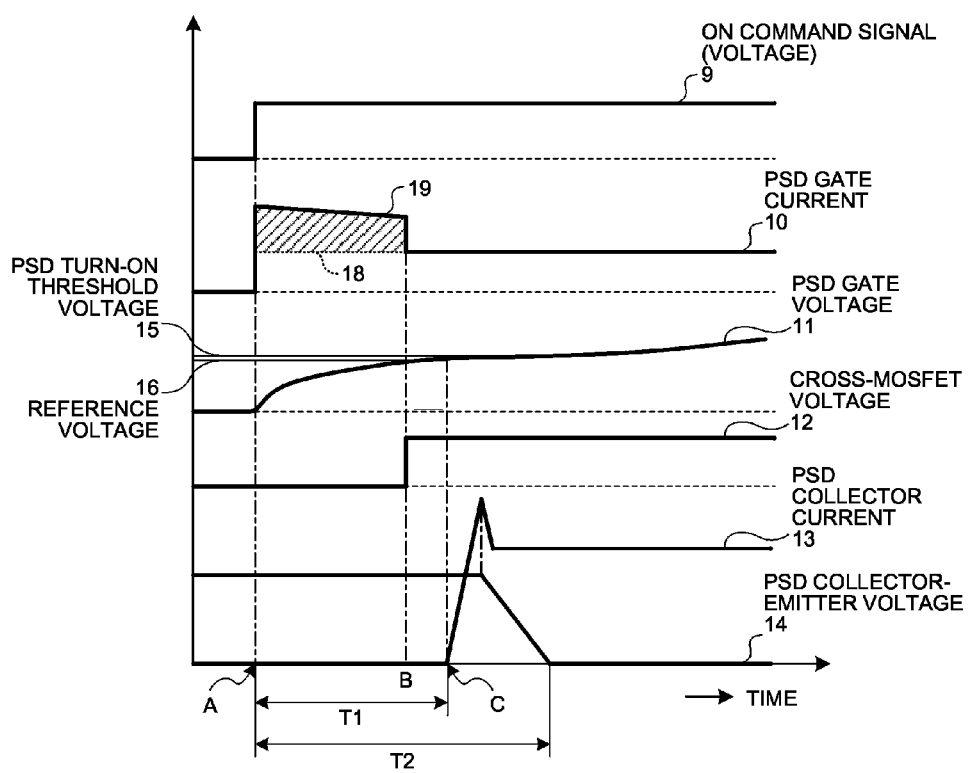
FIG. 3 is a time chart for explaining operations performed by the gate drive circuit according to the first embodiment.

Next, the operation performed by the gate drive circuit according to the first embodiment, that is, the operation in a case of using both the constant-current gate drive circuit 1 and the constant-voltage gate drive circuit 5 are explained with reference to FIGS. 1 and 3. FIG. 3 is a time chart for explaining the operation performed by the gate drive circuit according to the first embodiment. In the explanation of FIG. 3, the power semiconductor device is appropriately abbreviated as "PSD".

First, at the beginning of gate driving (before the operation time A shown in FIG. 3), the MOSFET 4 has been turned on. That is, the constant-voltage gate drive circuit 5 has been set to an operable state. In this state, when the ON command signal 9 is input to the constant-current gate drive circuit 1 from the power-semiconductor-device control circuit 3 (at the operation time A), the current supplied from the constant-voltage gate drive circuit 5 is superimposed on the current supplied from the constant-current gate drive circuit 1 at the gate of the IGBT 2, thereby charging the gate capacity of the IGBT 2. Regarding the waveform shown in the second from the top (the PSD gate current 10) in FIG. 3, a solid-line part 19 indicates a current waveform at the time of driving both the constant-current gate drive circuit 1 and the constant-voltage gate drive circuit 5, and a dashed-line part 18 indicates a current waveform at the time of controlling the MOSFET 4 to be turned off (at which time, the constant-voltage gate drive circuit 5 is isolated) and of driving only the constant-current gate drive circuit 1.

The gate voltage (PSD gate voltage) 11 of the IGBT 2 is input to the gate-voltage detection comparator 8-1. The gate-voltage detection comparator 8-1 compares the PSD gate voltage 11 with the reference voltage 16 applied from the reference voltage source 7. As shown in FIG. 3, this reference voltage 16 is set to be lower than a threshold voltage 15 (PSD turn-on threshold voltage) at the time of turning on the IGBT 2. With this setting, when the PSD gate voltage 11 gets closer to the PSD turn-on threshold voltage 15 and exceeds the reference voltage 16, the output from the gate-voltage detection comparator 8-1 is inverted, the MOSFET control circuit 6 operates to control the MOSFET 4 to be turned off (the voltage across MOSFET 12) rises from "LOW" to "HIGH"), the constant-voltage gate drive circuit 5 is disconnected from the constant-current gate drive circuit 1, and the gate drive circuit enters into a state where only the constant-current gate drive circuit 1 operates (at an operation time B).

Thereafter, when the PSD gate voltage 11 exceeds the PSD turn-on threshold voltage 15, a PSD collector current 13 starts to flow (at an operation time C), the PSD collector current 13 abruptly rises, and after it reaches the peak, then settles down to a predetermined value. Furthermore, the voltage (PSD collector-emitter voltage) 14 between the collector and the emitter of the IGBT 2 falls toward a zero potential after the PSD collector current 13 reaches its peak.

Due to the control described above, the time (a turn-on time) T1, which is until the IGBT 2 is turned on (A to C), is made shorter than the time in a case in which the gate capacity of the IGBT 2 is charged using only the constant-current gate drive circuit 1, and the time (an actual operation time) T2 since a start command is input until the IGBT 2 actually starts operating is also made shorter. The reason for shortening the turn-on time T1 and the actual operating time T2 is as follows.

By charging the gate capacity of the IGBT 2 using both the constant-current gate drive circuit 1 and the constant-voltage gate drive circuit 5, more electric charge amounts corresponding to the hatched area shown in FIG. 3 can be charged.

As attention is paid to the current waveform indicated by the solid part 19 in FIG. 3, it can be understood that the current value becomes smaller in accordance with the lapse of time. Such a current waveform is obtained because the PSD gate voltage 11 rises by charging the gate capacity of the IGBT 2 and as a result, the voltage across the resistor 5-1 falls. This result is due to the function of the resistor 5-1 electrically connected between input and output terminals of the constant-current gate drive circuit 1 when the MOSFET 4 is conductive, and can be obtained by allowing the constant-voltage gate drive circuit 5 to literally drive the IGBT 2 at a constant voltage. Furthermore, this function can suppress the gate voltage change during the transition to turning on the IGBT 2.

As described above, the gate drive circuit according to the first embodiment charges the gate capacity of the IGBT 2 using both the constant-current gate drive circuit 1 and the constant-voltage gate drive circuit 5 at the time of driving the IGBT 2 serving as the power semiconductor device. Therefore, it is possible to shorten the starting time while suppressing the gate voltage change during the transition to turning on the IGBT 2.

Second Embodiment

Figure 4:
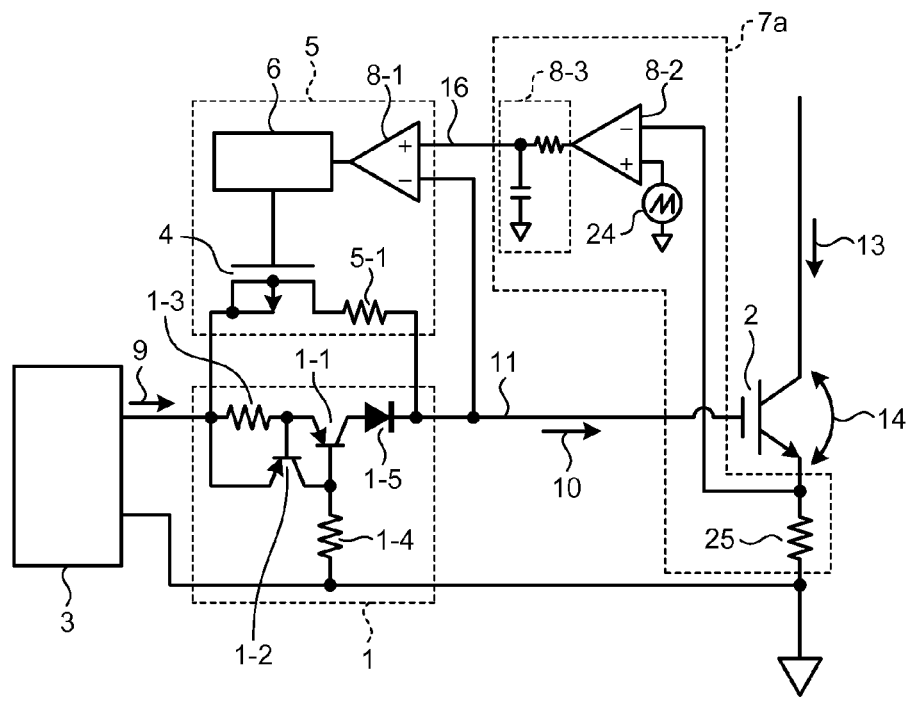
FIG. 4 depicts a configuration of a gate drive circuit according to a second embodiment.

FIG. 4 depicts a configuration of the gate drive circuit according to the second embodiment. The gate drive circuit shown in FIG. 4 differs from that shown in FIG. 1 according to the first embodiment in that the reference voltage source 7 has been replaced by a reference-voltage generation circuit 7a. Other configurations of the second embodiment are identical or equivalent to those according to the first embodiment shown in FIG. 1 and the common constituent elements are denoted by the same or similar reference signs, and common explanations thereof will be appropriately omitted.

A configuration and an operation of the reference-voltage generation circuit 7a are explained next. Basic operations performed by the gate drive circuit according to the second embodiment are equivalent to those performed by the gate drive circuit according to the first embodiment and the operation waveforms of principal constituent elements of the gate drive circuit according to the second embodiment are equivalent to those shown in FIG. 3.

With reference to FIG. 4, the reference-voltage generation circuit 7a is configured to include a current detection resistor 25 serving as a current detection unit that detects an emitter current of the IGBT 2, a triangular-wave power supply 24 that is a first power supply circuit, an output circuit 8-3 constituted by a capacitor and a resistor, and a current detection comparator 8-2 that serves as a second comparator for comparing the output from the triangular-wave power supply 24 with that from the current detection resistor 25.

In the second embodiment, the reference voltage 16 input to the gate-voltage detection comparator 8-1 is generated by the current detection comparator 8-2. The current detection comparator 8-2 generates the reference voltage 16 by comparing a triangular wave generated by the triangular-wave power supply 24 with an output from the current detection resistor 25, and inputs the generated reference voltage 16 to the gate-voltage detection comparator 8-1 via the output circuit 8-3. Subsequent operations are identical or equivalent to those according to the first embodiment.

The reference voltage 16 generated by the reference-voltage generation circuit 7a is set to be lower than the PSD turn-on threshold voltage 15 similarly to the first embodiment. This PSD turn-on threshold voltage 15 fluctuates depending on characteristics of the IGBT 2 and also depending on the current flowing to the collector of the IGBT 2. On the other hand, the gate drive circuit according to the second embodiment detects the collector current of the IGBT 2 and generates the reference voltage 16 using the detected collector current. Accordingly, even when the turn-on threshold voltage of the IGBT 2 changes, the gate drive circuit can execute the control to follow this change. This control makes it possible to generate the reference voltage 16 according to the characteristics of the IGBT 2 and to effectively execute a control for shortening the starting time. Alternatively, the gate drive circuit can detect an emitter current instead of the collector current. Furthermore, any detection unit other than the current detection resistor can be used.

As described above, the gate drive circuit according to the second embodiment charges the gate capacity of the IGBT 2 using both the constant-current gate drive circuit 1 and the constant-voltage gate drive circuit 5 at the time of driving the IGBT 2 serving as the power semiconductor device. Further, the gate drive circuit detects the current flowing to the IGBT 2 and controls the operation of the constant-voltage gate drive circuit 5 using the reference voltage generated by using the detected current. Therefore, in addition to the effects of the first embodiment, it is possible to achieve an effect of controlling the starting time to be shortened according to the characteristics of the IGBT 2.

Third Embodiment

Figure 5:
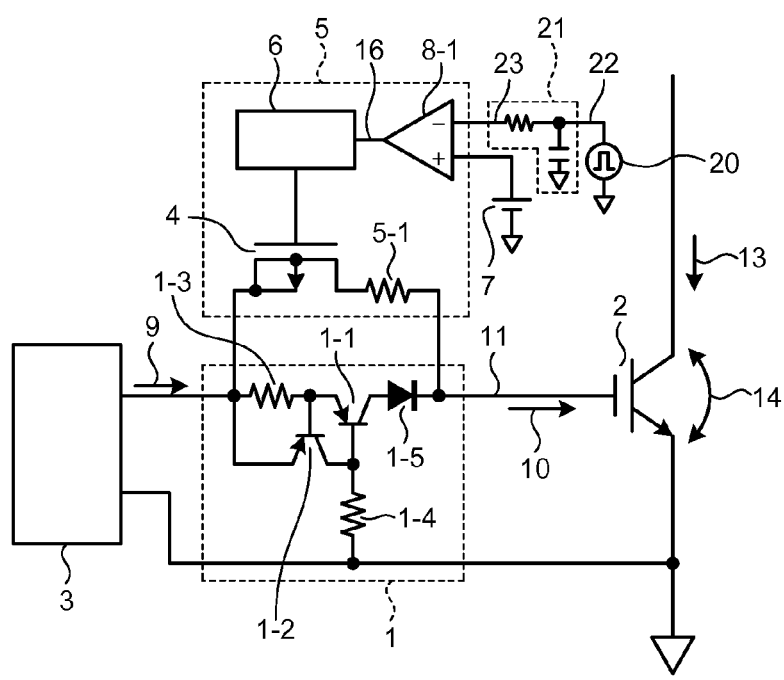
FIG. 5 depicts a configuration of a gate drive circuit according to a third embodiment.

FIG. 5 depicts a configuration of the gate drive circuit according to a third embodiment. The gate drive circuit shown in FIG. 5 is configured, differently from that of the first embodiment shown in FIG. 1, so that not the gate voltage of the IGBT 2 but a voltage signal generated in a self-contained manner is input to an inverted input terminal of the gate-voltage detection comparator 8-1. Specifically, the gate drive circuit according to the third embodiment is configured so as to include a square-wave power supply 20 that is a second power supply circuit and an RC filter 21 that serves as a filter circuit for smoothing a square wave voltage 22 output from the square-wave power supply 20, and configured such that a smoothed square wave voltage 23 output from the RC filter 21 is input to the inverted input terminal of the gate-voltage detection comparator 8-1. Other configurations of the third embodiment are identical or equivalent to those according to the first embodiment shown in FIG. 1 and common constituents are denoted by the same reference signs, and common explanations thereof will be appropriately omitted.

Figure 6:
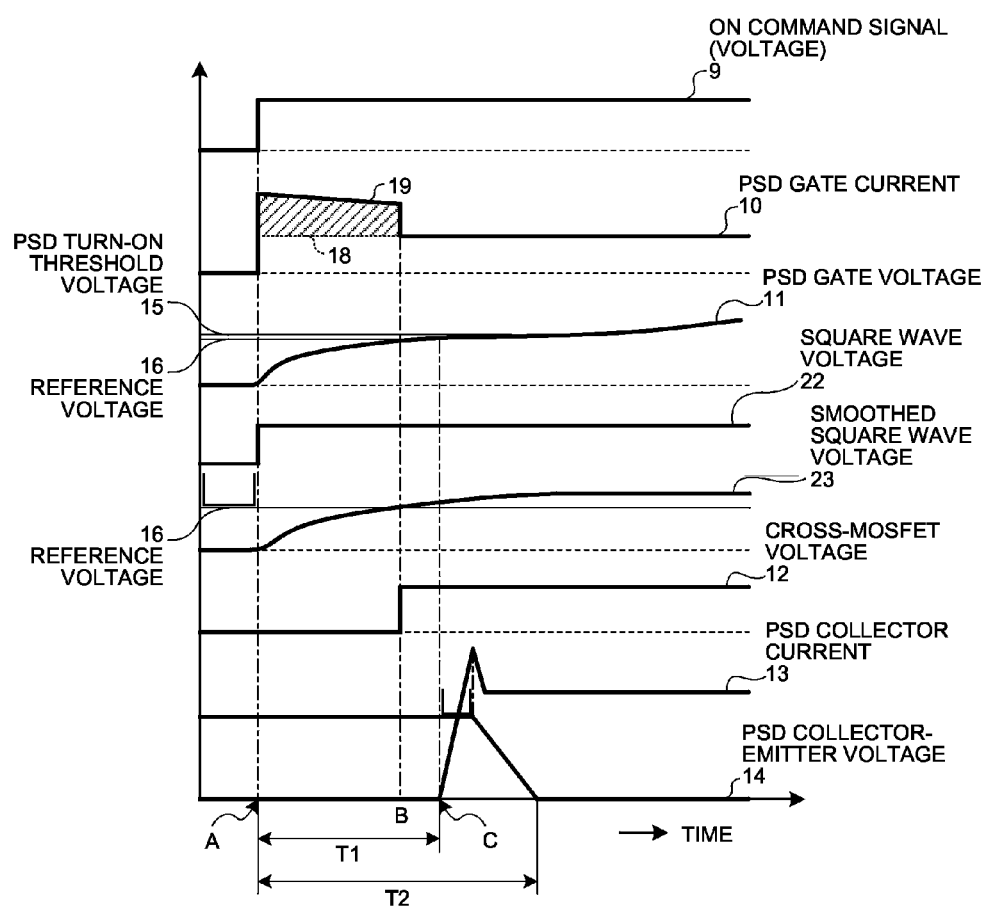
FIG. 6 is a time chart for explaining operations performed by the gate drive circuit according to the third embodiment.

Operations performed by the gate drive circuit according to the third embodiment are explained next with reference to FIGS. 5 and 6. FIG. 6 is a time chart for explaining the operations performed by the gate drive circuit according to the third embodiment. The time chart shown in FIG. 6 is basically identical or equivalent to that shown in FIG. 3 except that the square wave voltage 22 and the smoothed square wave voltage 23 are added in the middle of the time chart.

In the third embodiment, a time constant (=a product between R and C) of the RC filter 21 is set such that the smoothed square wave voltage 23 crosses the reference voltage 16 right before the IGBT 2 is turned on (see the smoothed square wave voltage 23 at a point B). That is, the RC filter 21 smoothes the square wave voltage 22 and the gate drive circuit operates so that the smoothed square wave voltage 23 reaches the reference voltage 16 before the IGBT 2 is turned on. Therefore, differently from the first embodiment, it is possible to drive the IGBT 2 without detecting the gate voltage (the PSD gate voltage 11) of the IGBT 2.

As described above, the gate drive circuit according to the third embodiment charges the gate capacity of the IGBT 2 using both the constant-current gate drive circuit 1 and the constant-voltage gate drive circuit 5 at the time of driving the IGBT 2 serving as the power semiconductor device. In addition, the constant-voltage gate drive circuit 5 is switched between an operating state and a non-operating state using a control signal (voltage) generated in a self-contained manner. Therefore, it is possible to achieve effects equivalent to those of the first embodiment without detecting the gate voltage.

The material of the power semiconductor device is explained as a matter common to the first through third embodiments. A semiconductor transistor device made of silicon (Si) (such as an IGBT or a MOSFET, hereinafter, "Si—SW") is generally used as the power semiconductor device. The technique described above is suited for use in this general Si—SW.

However, the above technique is not limited to a switching device formed of Si as a material. Needless to mention, the above technique is also applicable to a power semiconductor device made of silicon carbide (SiC) (hereinafter, "SiC—SW") to which attention is paid because of its capability of a high-speed switching operation and of which development is underway in place of Si.

The reason that the SiC—SW can perform a fast switching operation is as follows. Because the SiC—SW can be used at a high temperature and has a high heat resistance, it is possible to increase an allowable operating temperature of a device module that accommodates the SiC—SW to a high temperature side. Even if a carrier frequency is set to high to accelerate the switching rate, it is possible to prevent a cooler that cools the device module from becoming larger.

However, although being effective from the viewpoint of improving efficiency, the accelerated switching rate has a problem that since the change of a collector-emitter voltage (Vice) and a collector current (Ic) along with the time lapse (dv/dt and di/dt) is made abrupt, noise increases at the time of driving the SiC—SW.

On the other hand, the gate drive circuit according to the present embodiment uses both the constant-current gate drive circuit and the constant-voltage gate drive circuit at the time of driving the power semiconductor device, and suppresses the gate voltage change during the transition to turning on the power semiconductor device. Therefore, it is possible to suppress the noise caused by switching as compared with the conventional technique. That is, it is no exaggeration to state that the gate drive circuit according to the present embodiment of the present application functions effectively when using the SiC—SW as the power semiconductor device and can serve as one of techniques flexibly applicable to future trends.

The SiC is an example of semiconductors referred to as a "wide bandgap semiconductor" because of the characteristic that its bandgap is wider than that of Si. For example, semiconductors formed of a gallium nitride (GaN)-based material or diamond (C) also belong to the wide bandgap semiconductor in addition to this SiC. Characteristics of those semiconductors have many similarities to those of the SiC. Accordingly, the configuration using a wide bandgap semiconductor other than a SiC semiconductor is also in the scope of the present invention and can achieve effects identical to those of the case of SiC.

The configuration described in each of the first to third embodiments is only an example of the configuration of the present invention, and it is possible to combine the configuration with other publicly-known techniques, and it is needless to mention that the present invention can be configured while modifying it without departing from the scope of the invention, such as omitting a part of the configuration.

INDUSTRIAL APPLICABILITY

As described above, the present invention is useful as a gate drive circuit that can shorten the starting time while suppressing a gate voltage change at the time of turning on a power semiconductor device.

REFERENCE SIGNS LIST 1 current-constant gate drive circuit
1-1, 1-2 transistor
1-3, 1-4, 5-1 resistor
1-5 diode
3 power-semiconductor-device control circuit
4 MOSFET
5 constant-voltage gate drive circuit
6 MOSFET control circuit
7 reference voltage source
7a reference-voltage generation circuit
8-1 gate-voltage detection comparator (first comparator)
8-2 current detection comparator (second comparator)
8-3 output circuit
9 ON command signal (voltage)
10 gate current (PSD gate current)
11 gate voltage (PSD gate voltage)
13 PSD collector current
14 PSD collector-emitter voltage
15 PSD turn-on threshold voltage
16 reference voltage
20 square-wave power supply (second power supply circuit)
21 RC filter (filter circuit)
22 square wave voltage
23 smoothed square wave voltage
24 triangular-wave power supply (first power supply circuit)
25 current detection resistor (current detection unit)

The invention claimed is:
1. A gate drive circuit for driving a power semiconductor device, comprising:
a constant-current gate drive circuit that controls an amount of current flowing to a gate of the power semiconductor device to charge a gate capacity of the power semiconductor device at a constant current; and
a constant-voltage gate drive circuit that is connected in parallel to the constant-current gate drive circuit between input and output terminals thereof via a series circuit constituted by a switching device and a resistor, and charges the gate capacity at a constant voltage, wherein
at the time of turning the power semiconductor device on, the gate drive circuit charges the gate capacity of the power semiconductor device using both the constant-current gate drive circuit and the constant-voltage gate drive circuit.

2. The gate drive circuit according to claim 1, wherein
the constant-voltage gate drive circuit includes
a first comparator that compares the gate voltage of the power semiconductor device with a predetermined reference voltage, and
a switching-device control circuit that controls the switching device based on a comparison result of the first comparator, wherein
the first comparator generates a control signal for controlling the switching device to be turned off right before the power semiconductor device is turned on, and
the switching-device control circuit controls the switching device to be turned off based on the control signal output from the first comparator, and electrically disconnects the constant-voltage gate drive circuit from the constant-current gate drive circuit.

3. The gate drive circuit according to claim 2, further comprising a reference-voltage generation circuit that generates the reference voltage using the current flowing to the power semiconductor device.

4. The gate drive circuit according to claim 3, wherein
the reference-voltage generation circuit includes
a current detection unit that detects a current flowing to the power semiconductor device,
a first power supply circuit that generates a predetermined triangle wave voltage, and
a second comparator that compares a current value detected by the current detection unit with the triangle wave voltage, and outputs an output voltage based on a comparison result to the first comparator as the reference voltage.

5. The gate drive circuit according to claim 1, further comprising:
a second power supply circuit that generates a square wave voltage; and
a filter circuit that smoothes the square wave voltage, wherein
the constant-voltage gate drive circuit includes
a first comparator that compares a smoothed square wave voltage output from the filter circuit with a predetermined reference voltage, and
a switching-device control circuit that controls the switching device based on a comparison result of the first comparator,
the first comparator generates a signal for controlling the switching device to be turned off right before the power semiconductor device is turned on, and
the switching-device control circuit controls the switching device to be turned off based on a control signal output from the first comparator, and electrically disconnects the constant-voltage gate drive circuit from the constant-current gate drive circuit.

6. The gate drive circuit according to claim 1, wherein the power semiconductor device is an element formed of a wide bandgap semiconductor.

7. The gate drive circuit according to claim 6, wherein the wide bandgap semiconductor is a semiconductor using silicon carbide, a gallium-nitride-based material, or diamond.

8. The gate drive circuit according to claim 1, wherein the constant-current gate drive circuit comprises a switch and a resistor which is connected between an emitter and a base of the switch, and the switch is turned on in response to the amount of the current that flows through the resistor being increased.

9. The gate drive circuit according to claim 8, wherein the switch is turned on in response to a bias voltage between the emitter and the base of the switch being increased according to the increased amount of the current.

10. A gate drive circuit for driving a power semiconductor device, comprising:
a constant-current gate drive circuit that controls an amount of current flowing to a gate of the power semiconductor device to charge a gate capacity of the power semiconductor device at a constant current; and
a constant-voltage gate drive circuit that is connected in parallel to the constant-current gate drive circuit between input and output terminals thereof via a series circuit constituted by a switching device and a resistor, and charges the gate capacity at a constant voltage, wherein
the constant-voltage gate drive circuit is driven only for a period since an ON command for turning the power semiconductor device on is output until the power semiconductor device is turned on.

* * * * *